(12) United States Patent
Liu et al.

(10) Patent No.: US 6,995,571 B1
(45) Date of Patent: Feb. 7, 2006

(54) VECTOR NETWORK ANALYZER MIXER CALIBRATION USING THE UNKNOWN THRU CALIBRATION

(75) Inventors: James C. Liu, Santa Rosa, CA (US); Kenneth H. Wong, Santa Rosa, CA (US); David V. Blackham, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/028,161

(22) Filed: Jan. 3, 2005

(51) Int. Cl.
*G01R 35/00* (2006.01)
(52) U.S. Cl. .................... 324/601; 324/76.22
(58) Field of Classification Search ............ 324/76.22, 324/601
See application file for complete search history.

(56) References Cited

U.S. PATENT DOCUMENTS

| | | | |
|---|---|---|---|
| 6,300,775 B1 * | 10/2001 | Peach et al. ................. | 324/601 |
| 6,448,786 B1 * | 9/2002 | Dunsmore et al. .......... | 324/601 |
| 6,690,722 B1 * | 2/2004 | Dunsmore et al. .......... | 375/224 |

\* cited by examiner

*Primary Examiner*—Walter Benson

(57) ABSTRACT

In one embodiment, a method comprises applying a stimulus signal to a reference frequency translation device (FTD) by a vector network analyzer during a calibration mode, wherein the reference FTD possesses equal conversion efficiency in forward and reverse directions and the reference FTD possesses unknown input and output reflection characteristics; measuring a response of the reference FTD; and determining forward and reverse transmission tracking error terms using data from the measured response and single-port error calibration terms.

23 Claims, 2 Drawing Sheets

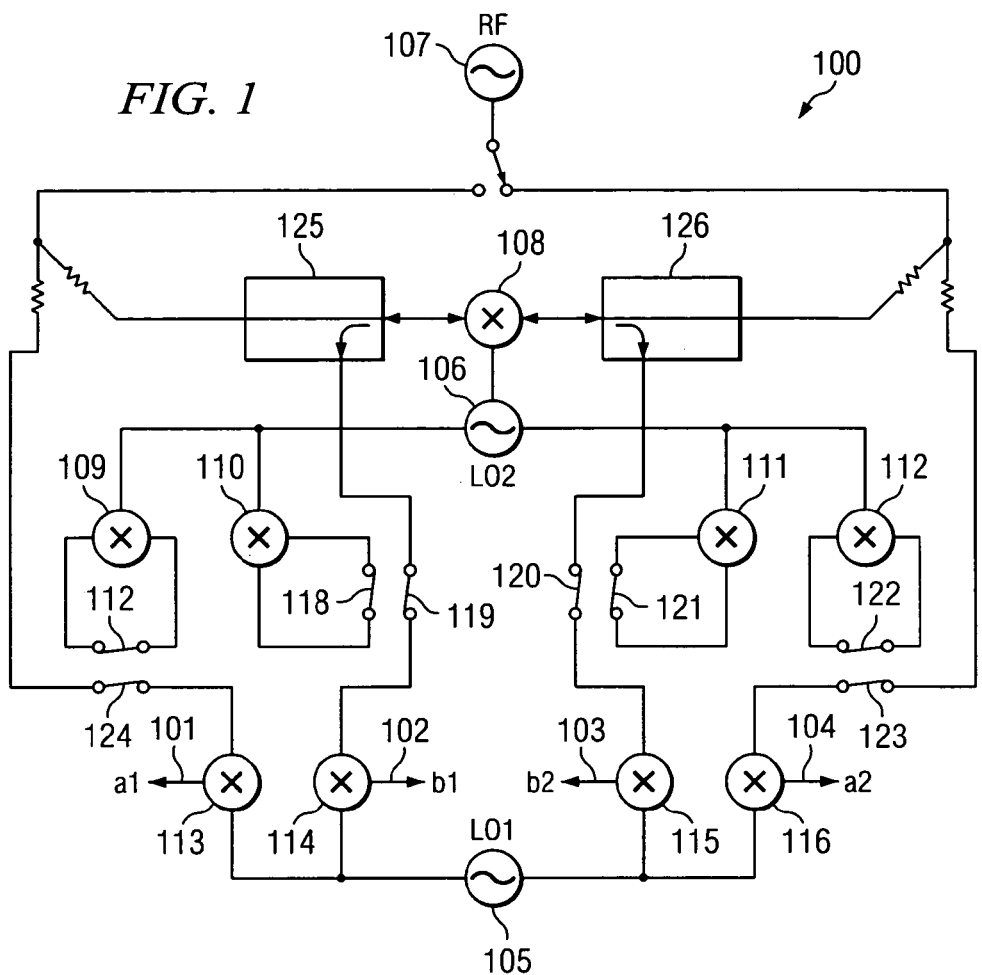

VECTOR NETWORK ANALYZER MIXER CALIBRATION USING THE UNKNOWN THRU CALIBRATION

TECHNICAL FIELD

The present application is generally related to calibration of a vector network analyzer.

BACKGROUND

Network analyzers are devices that are used to determine the radio frequency (RF) characteristics of various devices under test (DUTs). Network analyzers typically operate by sweeping a stimulus signal across a range of frequencies and applying the stimulus signal to a DUT and measuring the response of the DUT. The measurements generated by network analyzers typically possess inaccuracies due to a number of issues. For example, impedance mismatches associated with the network analyzer and/or a test set-up create errors in the measurements.

Calibration techniques can be applied to enable post-processing of the measurement data to mitigate the errors in the measurement data. In general, network analyzer calibration occurs by applying a stimulus signal to "standards" (devices having known or estimated characteristics) and estimating the systematic errors from the measurements. The "SOLT" type calibration methodology occurs by employing a "short" standard, an "open" standard, a "load" standard, and a "thru" standard. A methodology (the "unknown" thru method) has been developed that enables the calibration of a network analyzer using a thru standard without requiring the characteristics of the thru standard to be determined. The "unknown thru" methodology relies upon the general theory of eight term network analyzer error correction.

Frequency translation devices (FTDs), such as mixers, modulators, demodulators, and the like, present difficulties to the operation and calibration of network analyzers. Specifically, when a network analyzer makes a particular measurement, the measurement is taken at the same frequency as the current frequency of the stimulus signal. Since the output frequency of an FTD is different than the input to the FTD, ordinary network analyzer measurements cannot be used. To address this problem, a test methodology that employs three mixers and three sets of measurements has been developed that enables measurement of the characteristics of FTDs using a network analyzer.

Another methodology enables a network analyzer to be calibrated to enable vector error correction to be applied to FTD measurements. The methodology involves using a "reference" FTD that has been previously characterized to serve as the thru device. However, FTDs are subject to drift. To obtain the greatest amount of accuracy, the reference FTD must be recharacterized every time a calibration is to be performed. Specifically, failure to recharacterize causes an error in the calibration that is equal to the drift of the reference FTD. Also, the two measurement tiers (characterizing the reference FTD and measuring other FTDs of interest) creates a greater amount of measurement complexity and uncertainty.

SUMMARY

Some representative embodiments are directed to systems and methods for calibrating a network analyzer for measuring the characteristics of FTDs. Although the previously developed unknown thru methodology relies on the linearity of an unknown thru standard, representative embodiments enable an uncharacterized FTD to be used as a thru device for calibration of a network analyzer. Specifically, representative embodiments modify the unknown thru mathematics by using S-parameter measurements at different frequencies. Additionally, representative embodiments employ an FTD device that has equal forward and reverse conversion efficiency parameters. By making these modifications, the mathematics of the unknown thru is solvable for the network analyzer error terms of interest.

Some representative embodiments are directed to a vector network analyzer that operates in a calibration mode adapted to employ an uncharacterized FTD as an unknown thru. During the calibration, the vector analyzer applies a stimulus signal to the FTD and measures the response of the FTD. Multiple phase coherent mixers may be employed to ensure that measurements are made upon the appropriate forward and reverse frequencies. The measurements are processed by the network analyzer to generate suitable error correction terms of a suitable model. The error correction terms are then used to apply vector error correction to subsequent measurements of FTDs under test.

BRIEF DESCRIPTION OF THE DRAWINGS

FIG. 1 depicts a vector network analyzer for analyzing FTDs according to one representative embodiment.

FIG. 2 depicts an error box model according to one representative embodiment.

FIG. 3 depicts a signal flow graph according to one representative embodiment.

DETAILED DESCRIPTION

Figure 4:
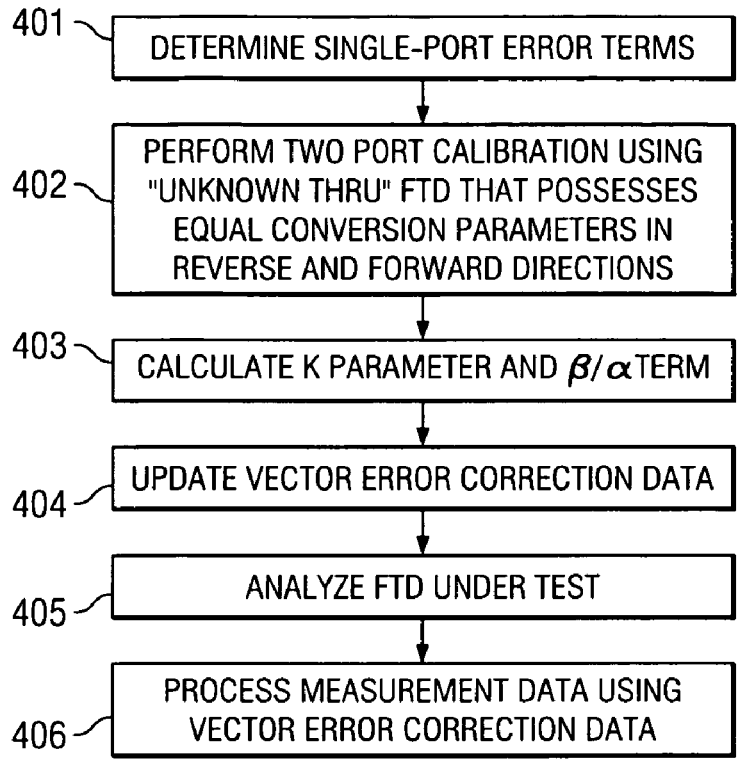
FIG. 4 depicts a flowchart according to one representative embodiment.

Some representative embodiments enable a network analyzer to be calibrated for analyzing FTDs using a single two-port calibration by employing a modified unknown thru methodology. To make the measurements associated with the unknown thru methodology, a four receiver frequency translation topology may be used such as vector network analyzer 100 as shown in FIG. 1. Analyzer 100 comprises a plurality of independently tunable narrow band receivers. Outputs 101 through 104 are the signals that are measured by the receivers to form the S-parameter (a1, b1, a2, and b2) measurements for subsequent processing to determine the systematic error terms.

Within analyzer 100, oscillator 106 drives FTD 108. During calibration operations, FTD 108 is the "unknown thru" standard and is subsequently referred to as the "reference" FTD. During ordinary measurement operations, FTD 108 is the device under test. Couplers 125 and 126 are disposed on both sides of FTD 108. Additionally, filters could be disposed on both sides of FTD 108 if desired. Oscillator 106 is also coupled to mixers 109–112 thereby relating up-conversion or down-conversion associated with mixers 109–112 to the frequency translation performed by FTD 108. Oscillator 105 drives mixers 113–116. Analyzer 100 further comprises switches 117–124. The arrangement of oscillators 105 and 106, mixers 109–116, and switches 117–124 maintains the phase relationship between outputs 101–104 and enables measurements in the forward direction and reverse direction to be made at the respective frequencies. Additional details regarding the operation of analyzer 100 may be found in U.S. patent application Ser. No. 10/967,877, entitled "Vector Network Analyzer With Independently Tuned Receivers Characterizes Frequency Translation Devices," which is incorporated herein by reference. Analyzer 100 is by way of example and other suitable topologies that enable measurements to occur at respective frequencies may be employed.

The alteration to the S-parameter version of the unknown thru mathematics involves replacing a subset of S-parameters ($S_{11}$, $S_{21}$, $S_{12}$, $S_{22}$) with conversion parameters ($S_{11}$, $C_{21}$, $C_{12}$, $S_{22}$). In addition, while traditional S-parameter calibrations have the forward and reserve error terms at the same frequency, conversion parameter calibrations have forward and reverse error terms at different frequencies according to representative embodiments. The different frequencies are noted in the following mathematical proof by superscripting the forward error terms with f1 and superscripting the reverse error terms with f2.

The topology of analyzer 100 can be modeled using error box model 200 shown in FIG. 2. With four measurements taken in the forward direction and four measurements taken in the reserve direction, the raw S-parameters are defined as follows:

$$[S_m] = \begin{bmatrix} \frac{b_{1mf}^{f2}}{a_{1mf}^{f2}} & \frac{b_{1mf}^{f2}}{a_{2mr}^{f2}} \\ \frac{b_{2mf}^{f2}}{a_{1mf}^{f2}} & \frac{b_{2mf}^{f2}}{a_{2mr}^{f2}} \end{bmatrix} = \begin{bmatrix} S_{11M} & S_{12M} \\ S_{21M} & S_{22M} \end{bmatrix} \quad \text{(eq. 1)}$$

$$[S_{mc}] = \begin{bmatrix} S_{11mc} & S_{12mc} \\ S_{21mc} & S_{22mc} \end{bmatrix}; [M_{sc}] = \begin{bmatrix} 1 & \frac{a_{1mr}^{f2}}{b_{1mr}^{f2}} \\ \frac{a_{2mf}^{f2}}{b_{2mf}^{f2}} & 1 \end{bmatrix} = \begin{bmatrix} 1 & \Gamma_r \\ \Gamma_f & 1 \end{bmatrix}$$

where $[S_m] = [S_{mc}] * [M_{sc}]$ and $[S_{mc}] = [S_m] * [M_{sc}]^{-1}$

Thus, the measurement process begins in a manner that is similar to typical two-port calibration methodologies with the exception that the respective forward and reverse measurements occur at different frequencies. After the raw measurements are obtained, a conventional correction is applied to correct for the switch error of the network analyzer. Specifically, $[S_{mc}]$ is the switch error corrected S-parameter measurements.

It is more convenient to solve the system equation in matrix form or T-parameters. Using signal flow graph 300 of FIG. 3, equation (2) is derived as follows:

$$[T_{mc}] = [A] * [T] * [B] = \quad \text{(eq. 2)}$$

$$\left(\frac{\beta^{f2}}{\alpha^{f2}}\right)\left(\frac{1}{E_{RR}^{f2}}\right)\begin{bmatrix} \Delta_A & E_{DF}^{f2} \\ -E_{SF}^{f1} & 1 \end{bmatrix} * [T] * \begin{bmatrix} \Delta_B & E_{SR}^{f2} \\ -E_{DR}^{f2} & 1 \end{bmatrix}$$

$$T_{mc} = \frac{1}{S21_{mc}}\begin{bmatrix} -\Delta_{sm} & S11_{mc} \\ -S22_{mc} & 1 \end{bmatrix};$$

where $\Delta_{sm} = S11_{mc}S22_{mc} - S21_{mc}S12_{mc}$ $$T = \frac{1}{C_{21}}\begin{bmatrix} \Delta_T & S_{11} \\ -S_{22} & 1 \end{bmatrix}; \Delta_T = C_{21}C_{12} - S_{11}S_{22};$$

-continued $$\Delta_A = E_{RF}^{f2l} - E_{DF}^{f2}E_{SF}^{f2}; \Delta_B = E_{RR}^{f2} - E_{DR}^{f2}E_{SR}^{f2}$$

$T_{mc}$ is the transfer parameter version of the switch error corrected measurement. The error terms include terms for directivity (denoted by subscript "D"), source match (denoted by subscript "S"), reflection tracking (denoted by subscript "R"). The directivity, source match, and reflection tracking error terms can be determined from conventional linear single-port calibration methodologies. For the purpose of the present mathematical discussion, it is assumed that these error terms are known.

The derivation of equation (2) is similar to the mathematics associated with linear unknown thru mathematics. The mathematics differs, in one respect, by replacing the typical $S_{12}$ and $S_{21}$ terms with the conversion parameters $C_{12}$ and $C_{21}$. The conversion parameters reflect the efficiency of the frequency translation between the respective sides of the reference FTD.

As previously noted, the reference FTD preferably possesses equal conversion efficiency ($C_{21}=C_{12}$). If this condition is true, then $|T|=1$ and the following simplifications can be made:

$$|T_{mc}|=|A|*|T|*|B|=k^2|A'|*|B'|$$

$$k = \left(\frac{\beta^{f2}}{\alpha^{f12}}\right)\left(\frac{1}{E_{RR}^{f2}}\right); [A'] = \begin{bmatrix} \Delta_A & E_{DF}^{f2} \\ -E_{SF}^{f2} & 1 \end{bmatrix}; |B'| = \begin{bmatrix} \Delta_B & E_{SR}^{f2} \\ -E_{DR}^{f2} & 1 \end{bmatrix}$$

To solve for k and $\beta/\alpha$, the derivation continues as follows:

$$|T_{mc}| = \frac{S_{12mc}}{S_{21mc}}; |A'| = E_{RF}^{f/2}; |B'| = E_{RR}^{f2} \quad \text{(eq. 3)}$$

$$k^2 = \frac{|T_{mc}|}{|A'|*|B'|} = \frac{S_{12mc}}{S_{21mc}E_{RF}^{f/2}E_{RR}^{f2}}$$

$$k = \pm\sqrt{\frac{S_{12mc}}{S_{21mc}E_{RF}^{f/2}E_{RR}^{f2}}}; \frac{\beta^{f2}}{\alpha^{f2l}} = kE_{RR}^{f2}$$

It is noted that the sign of parameter k is usually determined through an assumption regarding the phase of the reference FTD. The forward transmission tracking and the reverse transmission tracking may then be calculated as follows:

$$E_{TF} = k\left(\frac{E_{RR}}{1 - E_{DR}\Gamma_f}\right), E_{TR} = k\left(\frac{E_{RF}}{1 - E_{DF}\Gamma_r}\right) \quad \text{(eq. 4)}$$

Accordingly, all of the systematic error terms have been determined. The vector error correction data of the network analyzer may be updated using equation (4). The vector network analyzer is then ready to analyze FTDs of interest.

FIG. 4 depicts flowchart 400 according to one representative embodiment. In step 401, typical single-port error terms are determined such as directivity, source match, and reflection tracking. In step 402, a two-port calibration is performed wherein a stimulus signal is applied to the ports of a reference FTD and measurements of the response of the FTD are obtained at two respective frequencies. The reference FTD may possess unknown input and output reflection characteristics by selecting a reference FTD that possesses substantially equal conversion efficiency in forward and reverse directions. In step 403, the k parameter and β/α term are calculated. In step 404, the vector error correction data of the vector network analyzer is updated using these terms (e.g., the forward and reverse tracking error terms are calculated). In step 405, an FTD under test is analyzed. In step 406, the data associated with the FTD under test is processed according to vector error correction.

Figure 5:
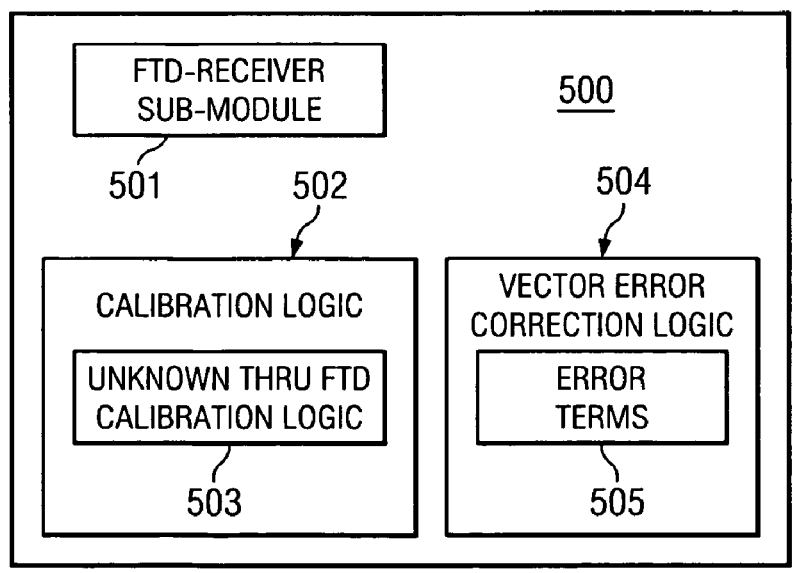
FIG. 5 depicts a vector analyzer according to one representative embodiment.

FIG. 5 depicts vector network analyzer 500 according to one representative embodiment. As shown in FIG. 5, analyzer 500 includes FTD-receiver submodule 501. Receiver submodule 501 preferably enables measurements to be made in the forward and reverse directions at suitable respective frequencies. Analyzer 500 further includes calibration logic 502 which may be implemented as processor executable instructions, integrated circuitry, and/or the like. Calibration logic 502 may perform conventional one-port calibration procedures. Also, calibration logic 502 additionally performs two-port calibration using unknown thru calibration logic 503. Calibration logic 502 updates error terms 505 upon completion of calibration procedures. When measurement operations are subsequently performed, vector error correction logic 504 applies errors terms 505 to measurement data to enable FTD devices to be analyzed in an accurate manner. In an alternative embodiment, calibration logic 502 and vector error correction logic 504 are implemented on a separate system (e.g., a computer that post-processes the measurement data).

Some representative embodiments may provide a number of advantages. For example, the calibration process according to some representative embodiments involves relatively little complexity and is similar to calibration procedures used for traditional linear devices. Also, by utilizing a two-port calibration, some representative embodiments enable a greater dynamic range of a network analyzer to be utilized for analysis of FTDs.

What is claimed is:

1. A method, comprising:
applying a stimulus signal to a reference frequency translation device (FTD) by a vector network analyzer during calibration, wherein said reference FTD possesses equal conversion efficiency in forward and reverse directions and said reference FTD possesses unknown input and output reflection characteristics;
measuring a response of said reference FTD; and
determining forward and reverse transmission tracking error terms using data from said measured response and single-port error calibration terms.

2. The method of claim 1 wherein said data from said measured response comprises a switch error corrected $C_{12}$ data measurement and a switch error corrected $C_{21}$ data measurement.

3. The method of claim 1 wherein said determining comprises:
calculating a parameter using data from said measured response, a forward reflection error term, and a reverse reflection error term.

4. The method of claim 3 wherein a magnitude of said parameter equals a square root of: a switch error corrected $C_{12}$ data measurement divided by a switch error corrected $C_{21}$ data measurement, said forward reflection error term, and said reverse reflection error term.

5. The method of claim 1 wherein said forward transmission tracking error term is calculated using the following equation:

$$E_{TF} = k\left(\frac{E_{RR}}{1 - E_{DR}\Gamma_f}\right).$$

6. The method of claim 1 wherein said reverse transmission tracking error term is calculated using the following equation:

$$E_{TR} = k\left(\frac{E_{RF}}{1 - E_{DF}\Gamma_r}\right).$$

7. The method of claim 1 wherein said measuring a response comprises:
measuring signals at two respective frequencies corresponding to said stimulus signal and a frequency-converted signal.

8. The method of claim 1 further comprising:
up-converting an output of said reference FTD by an amount that is related to frequency translation performed by said reference FTD before performing said measuring.

9. The method of claim 1 further comprising:
down-converting an output of said reference FTD by an amount that is related to frequency translation performed by said reference FTD before performing said measuring.

10. The method of claim 1 wherein said measuring comprises:
operating a plurality of phase-coherent mixers to process said stimulus signal and a frequency-converted signal from said reference FTD.

11. The method of claim 1 further comprising:
performing intermediate frequency (IF) filtering on at least one side of said reference FTD.

12. The method of claim 1 further comprising:
applying a stimulus signal to an FTD under test;
measuring a response of said FTD under test to generate test data; and
performing vector error correction on said test data using said forward and reverse transmission tracking terms.

13. A system for determining radio frequency (RF) characteristics of devices, comprising:
a source for applying a stimulus signal to a reference frequency translation device (FTD) during a calibration mode of said system, wherein said reference FTD possesses equal conversion efficiency in forward and reverse directions and said reference FTD possesses unknown input and output reflection characteristics;
a plurality of receivers for measuring a response of said reference FTD to said stimulus signal; and
logic for calculating forward and reverse transmission tracking error terms using data from said measured response and single-port error calibration terms.

14. The system of claim 13 wherein said response data comprises a switch error corrected $C_{12}$ data measurement and a switch error corrected $C_{21}$ data measurement.

15. The system of claim 13 wherein said logic for calculating calculates a parameter using data from said measured response, a forward reflection error term, and a reverse reflection error term.

16. The system of claim 15 wherein a magnitude of said parameter equals a square root of: a switch error corrected $C_{12}$ data measurement divided by a switch error corrected $C_{21}$ data measurement, said forward reflection error term, and said reverse reflection error term.

17. The system of claim 13 wherein said forward transmission tracking error term is calculated using the following equation:

$$E_{TF} = k\left(\frac{E_{RR}}{1 - E_{DR}\Gamma_f}\right).$$

18. The method of claim 13 wherein said reverse transmission tracking error term is calculated using the following equation:

$$E_{TR} = k\left(\frac{E_{RF}}{1 - E_{DF}\Gamma_r}\right).$$

19. The system of claim 13 wherein said plurality of receivers measure signals at two respective frequencies corresponding to said stimulus signal and a frequency-converted signal.

20. The system of claim 13 further comprising:

at least one up-converter for up-converting an output of said reference FTD before processing by one of said plurality of receivers, wherein said up-converter applies an amount of up-conversion that is related to an amount of frequency translation performed by said reference FTD.

21. The system of claim 13 further comprising:

at least one down-converter for down-converting an output of said reference FTD before processing by one of said plurality of receivers, wherein said down-converter applies an amount of down-conversion that is related to an amount of frequency translation performed by said reference FTD.

22. The system of claim 13 wherein said plurality of receivers are phased-locked receivers.

23. The system of claim 13 further comprising:

an intermediate frequency (IF) filter for filtering an output of said reference FTD.

\* \* \* \* \*